United States Patent
Dan

(10) Patent No.: US 10,418,950 B1
(45) Date of Patent: Sep. 17, 2019

(54) METHODS AND APPARATUS FOR A CLASS-D AMPLIFIER

(71) Applicant: SEMICONDUCTOR COMPONENTS INDUSTRIES, LLC, Phoenix, AZ (US)

(72) Inventor: Toru Dan, Gifu (JP)

(73) Assignee: SEMICONDUCTOR COMPONENTS INDUSTRIES, LLC, Phoenix, AZ (US)

(*) Notice: Subject to any disclaimer, the term of this patent is extended or adjusted under 35 U.S.C. 154(b) by 0 days.

(21) Appl. No.: 15/974,884

(22) Filed: May 9, 2018

(51) Int. Cl.
*H03F 3/21* (2006.01)
*H03F 3/217* (2006.01)
*H03F 1/30* (2006.01)

(52) U.S. Cl.
CPC .......... *H03F 3/2173* (2013.01); *H03F 1/30* (2013.01); *H03F 2200/03* (2013.01); *H03F 2200/331* (2013.01); *H03F 2200/372* (2013.01)

(58) Field of Classification Search
CPC .................................................. H03F 3/2173
See application file for complete search history.

(56) References Cited

U.S. PATENT DOCUMENTS

| | | | |
|---|---|---|---|
| 5,805,020 A | 9/1998 | Danz | |
| 6,473,457 B1* | 10/2002 | Pascual | G11B 20/10527 |
| | | | 332/109 |
| 7,308,027 B1 | 12/2007 | Gaboriau | |
| 7,706,438 B1* | 4/2010 | Gaboriau | H03K 7/08 |
| | | | 341/53 |
| 9,509,261 B2 | 11/2016 | Buono et al. | |
| 2004/0161122 A1 | 8/2004 | Nielson | |
| 2004/0223545 A1* | 11/2004 | Lee | H03M 3/506 |
| | | | 375/238 |
| 2007/0121962 A1 | 5/2007 | Adachi | |
| 2007/0188220 A1 | 8/2007 | Masuda | |
| 2008/0042745 A1 | 2/2008 | Kozak | |
| 2008/0111620 A1 | 5/2008 | Menard | |
| 2009/0010457 A1* | 1/2009 | Munenaga | H03F 3/2173 |
| | | | 381/120 |
| 2010/0109768 A1 | 5/2010 | Kotowski | |
| 2012/0045076 A1* | 2/2012 | Gonano | H03F 1/305 |
| | | | 381/120 |
| 2014/0266455 A1* | 9/2014 | Kaatz | H03F 1/565 |
| | | | 330/286 |
| 2015/0180426 A1* | 6/2015 | Kingsley | H03F 1/565 |
| | | | 330/277 |
| 2016/0329867 A1* | 11/2016 | Lesso | H03F 1/3241 |

FOREIGN PATENT DOCUMENTS

| | | |
|---|---|---|
| JP | 2001223537 A | 8/2001 |
| JP | 2008217583 A | 8/2005 |
| JP | 2007036736 A | 2/2007 |
| JP | 2008153999 A | 7/2008 |
| JP | 2009060466 A | 3/2009 |
| JP | 2010118761 A | 5/2010 |

* cited by examiner

*Primary Examiner* — Patricia T Nguyen
(74) *Attorney, Agent, or Firm* — The Noblitt Group, PLLC; Hettie L. Haines

(57) ABSTRACT

Various embodiments of the present technology comprise a method and apparatus for a class-D amplifier. In various embodiments, the class-D amplifier operates to control an output signal during a start-up state to suppress a pop noise (start-up noise) without the need for a mute switch. The class-D amplifier may utilize a transition signal during the start-up state to prime or otherwise stabilize the output signal to suppress the pop noise.

19 Claims, 7 Drawing Sheets

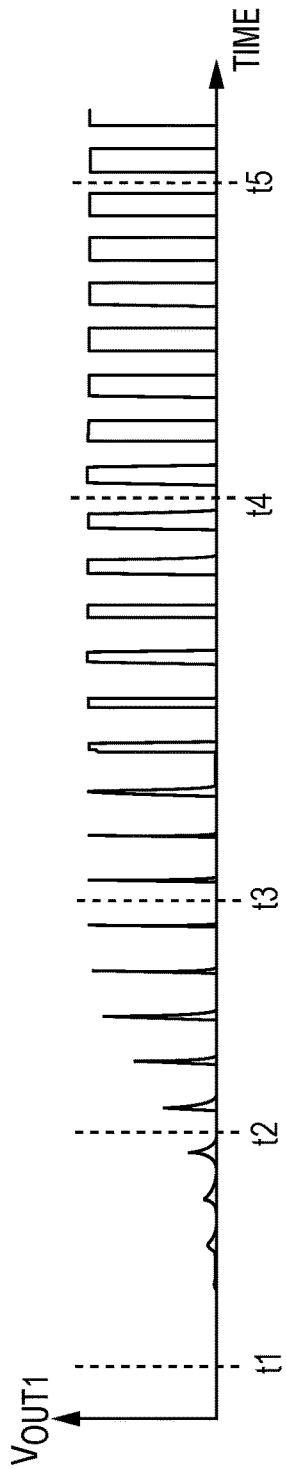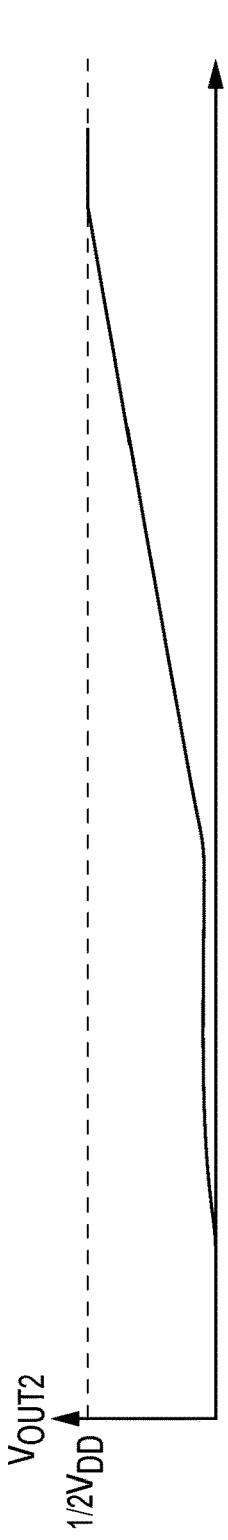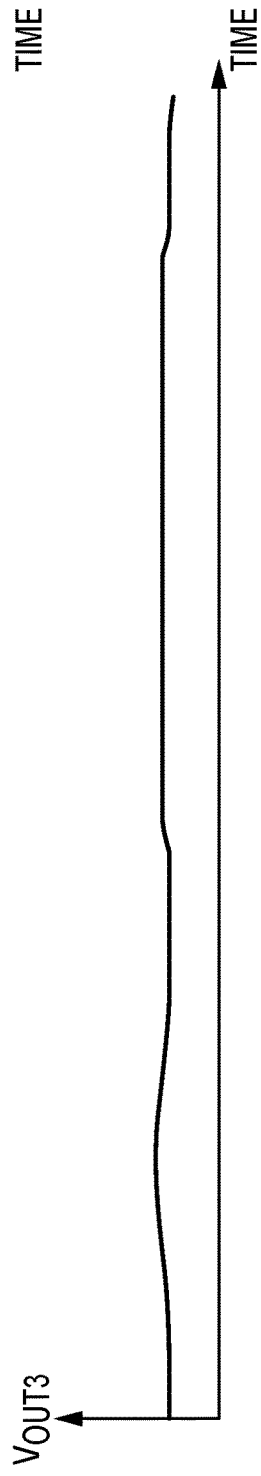

METHODS AND APPARATUS FOR A CLASS-D AMPLIFIER

BACKGROUND OF THE TECHNOLOGY

Class-D amplifiers are commonly used in audio systems to convert an audio signal into high-frequency pulses that switch the output in accordance with the audio input signal. Single-ended class-D amplifiers, which typically employ a capacitor to remove the DC component of the signal, generate a rush current upon start-up. When the rush current is added to the capacitor, a user will hear a start-up noise (generally described as a pop or click noise) through the speaker. Conventional methods for addressing the start-up noise are not desirable because they do not remove the noise entirely, require additional circuitry, such as a mute switch, and/or require additional control circuits to extend the dynamic range of the system.

SUMMARY OF THE INVENTION

Various embodiments of the present technology comprise a method and apparatus for a class-D amplifier. In various embodiments, the class-D amplifier operates to control an output signal during a start-up state to suppress a pop noise without the need for a mute switch. The class-D amplifier may utilize a transition signal during the start-up state to prime or otherwise stabilize the output signal to suppress the pop noise.

BRIEF DESCRIPTION OF THE DRAWING FIGURES

A more complete understanding of the present technology may be derived by referring to the detailed description when considered in connection with the following illustrative figures. In the following figures, like reference numbers refer to similar elements and steps throughout the figures.

FIG. 5 is a driver output voltage (a first node voltage) waveform from a first time period to a fifth time period and in accordance with an exemplary embodiment of the present technology;

FIG. 6 is a second node voltage versus time in accordance with an exemplary embodiment of the present technology;

FIG. 7 is a third node voltage versus time in accordance with an exemplary embodiment of the present technology;

DETAILED DESCRIPTION OF EXEMPLARY EMBODIMENTS

The present technology may be described in terms of functional block components and various processing steps. Such functional blocks may be realized by any number of components configured to perform the specified functions and achieve the various results. For example, the present technology may employ various switching circuit, interpolators, noise shaping circuits, drive circuits, amplifiers, signal converters, and the like, which may carry out a variety of functions. In addition, the present technology may be practiced in conjunction with any number of systems, such as audio systems, medical hearing devices, servo control applications, and the like, and the systems described are merely exemplary applications for the technology. Further, the present technology may employ any number of conventional techniques for generating control signals.

Figure 1:
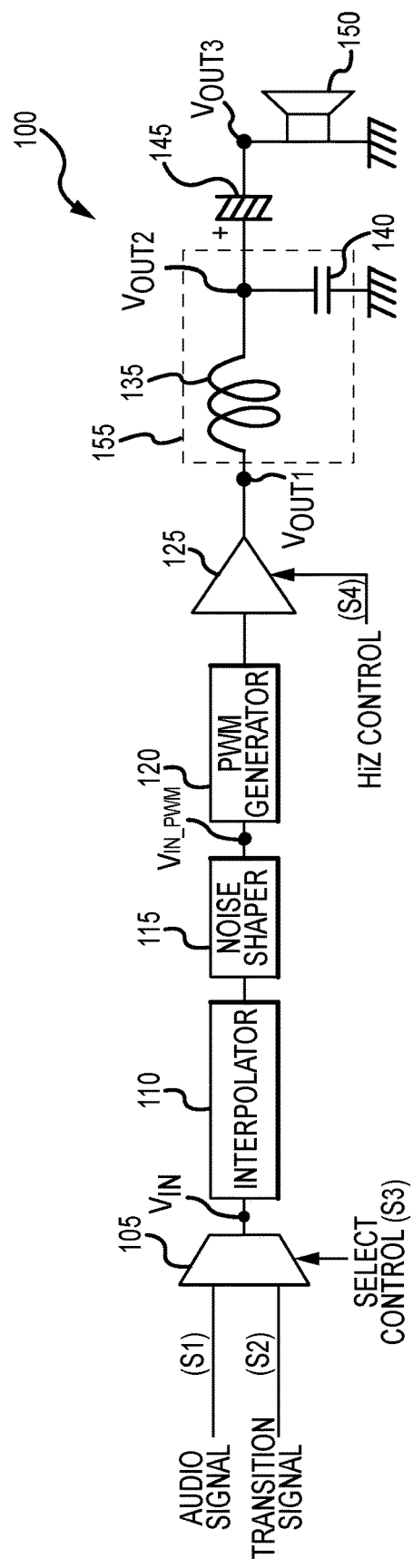
FIG. 1 is a block diagram of a class-D amplifier in accordance with an exemplary embodiment of the present technology.

Methods and apparatus for a class-D amplifier according to various aspects of the present technology may operate in conjunction with any suitable audio system, such a speaker system, "wearables" (e.g., ear buds), medical hearing devices, and the like. Referring to FIG. 1, an exemplary class-D amplifier 100 may be incorporated into an audio system to provide improved performance during a start-up of the audio system. For example, in various embodiments, the class-D amplifier 100 may comprise a switching circuit 105, an interpolator circuit 110, a noise-shaper circuit 115, a pulse-width modulation (PWM) generator circuit 120, a driver circuit 125, a low-pass filter 155, and a polarized capacitor 145, that operate together to process and deliver an audio signal to an audio output device 150. The class-D amplifier 100 may further operate to suppress a start-up noise (e.g., a pop or click) at the start-up of the audio system. According to various embodiments, the class-D amplifier may further operate in conjunction with a controller (not shown), a microprocessor, or the like, to generate and transmit various control signals.

The class-D amplifier 100 may receive an audio signal S1 and a transition signal S2. A separate component of the audio system, such as a digital music file (not shown), may generate the audio signal S1, and the audio signal S1 may be described according to a full scale value. For example, if the audio signal S1 is 24 bits, the full scale value of the audio signal S1 is $-2^{23}$ to $2^{23}$.

Figure 2:
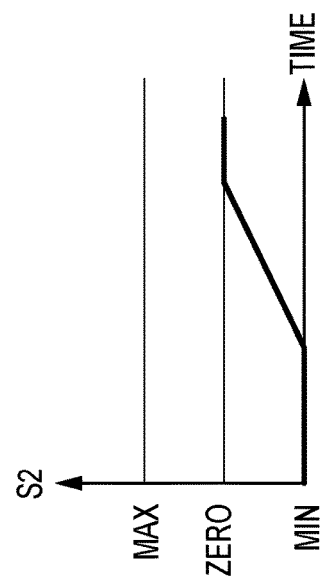
FIG. 2 is a transition signal used in the class-D amplifier in accordance with an exemplary embodiment of the present technology.

The controller may generate the transition signal S2. Referring to FIG. 2, the transition signal S2 may be selectively controlled over a period of time. For example, the transition signal S2 may start at a minimum value, for example a negative value, and increase until the transition signal S2 reaches a predetermined value, such as a zero value. For example, the transition signal S2 may increase linearly.

The switching circuit 105 may receive both the audio signal S1 and the transition signal S2 and select one of the signals as an input signal VIN. The switching circuit 105 may select and transmit either the audio signal S1 or the transition signal S2 to the interpolator 110 according to a first control signal S3. The controller (or microprocessor) may generate and transmit the first control signal S3 to an input terminal of the switching circuit 105. According to various embodiments, the switching circuit 105 may comprise a multiplexer or the like. For example, the switching circuit 105 may transmit the audio signal S1 if the first control signal S3 is a "1" and may transmit the transition signal S2 if the first control signal S3 is a "0." The controller may generate the first control signal S3 according to a mode (or state) of operation of the audio system.

In an exemplary embodiment, the switching circuit 105 is connected in series with the interpolator 110. For example, an output terminal of the switching circuit 105 is connected to an input terminal of the interpolator 110.

The interpolator circuit 110 is configured to receive the input signal VIN from the switching circuit 105 and upsample (increase the sampling rate) the input signal VIN. The interpolator circuit 110 may comprise any interpolator circuit suitable for upsampling in an audio system. For example, the interpolator circuit 110 may be configured as a finite impulse response (FIR) interpolator and upsample the input signal VIN by a factor of, for example, 1 and up to a factor of 8. The input signal VIN may comprise either the audio signal S1 or the transition signal S2 based on the first control signal S3.

In an exemplary embodiment, the interpolator circuit 110 is connected in series with the noise-shaper circuit 115. For example, an output terminal of the interpolator circuit 110 is connected to an input terminal of the noise-shaper circuit 115.

The noise-shaper circuit 115 is configured to reduce (or remove) noise in a desired frequency range by pushing the noise spectrum to higher frequencies. The noise-shaper circuit 115 may comprise any circuit suitable for reducing or removing noise from a signal. For example, the noise-shaper circuit 115 may comprise a delta-sigma modulator of any order (e.g., a fifth order delta sigma modulator).

The noise-shaper circuit 115 is connected in series with the interpolator circuit 110 and the PWM generator circuit 120. For example, the input terminal of the noise-shaper circuit 115 may receive a signal from the interpolator circuit 110 and an output terminal of the noise-shaper circuit 115 may be connected to an input terminal of the PWM generator circuit 120.

The PWM generator circuit 120 may generate a square wave (i.e., a pulse) output signal that is pulse-width modulated and has a duty cycle that is proportional to an input signal $V_{IN\_PWM}$. The PWM generator circuit 120 may comprise a conventional PWM generator or any other circuit suitable for generating a pulse-width modulated output signal. According to an exemplary embodiment, the PWM generator circuit 120 is connected in series with and receives an output signal (i.e., $V_{IN\_PWM}$) from the noise-shaper circuit 115. Accordingly, the output signal from the noise-shaper circuit 115 controls the duty cycle of the output signal of the PWM generator circuit 120. In an exemplary embodiment, the PWM generator circuit 120 is further connected in series with the driver circuit 125. For example, an output terminal of the PWM generator circuit 120 is connected to an input terminal of the driver circuit 125.

The driver circuit 125 controls or otherwise regulates a voltage and/or a current used to power the audio output device 150. The drive circuit 125 may receive an output signal from PWM generator circuit 120 at a first input terminal and a fourth control signal S4 (HiZ control) at a second input terminal. According to an exemplary embodiment, the controller may generate the fourth control signal S4, and the fourth control signal S4 controls an output impedance of the driver circuit 125. The driver circuit 125 generates and transmits a first output signal $V_{OUT1}$ to an input terminal of the LPF 155 at a first node.

The LPF 155 removes high-frequency switching components introduced by the PWM generator circuit 120 and recovers audio signals that the audio output device 150 can use. The LPF 155 may act as a passive integrator that generates an output that is equal to the average value of the square wave. The LPF 155 may comprise any circuit capable of attenuating high frequencies of an input signal, such as the first output signal $V_{OUT1}$ from the driver circuit 125. For example, the LPF 155 may comprise an inductor 135 and a capacitor 140. The LPF 155 may be connected to an output terminal of the driver circuit 125 and receive the first output signal $V_{OUT1}$. The LFP 155 may produce a second output signal $V_{OUT2}$ at a second node.

The polarized (i.e., electrolytic) capacitor 145 may block DC components of a signal. For example, the polarized capacitor 145 may be configured as a coupling capacitor and comprise a conventional polarized capacitor, such as an aluminum electrolytic capacitor, a tantalum electrolytic capacitor, a niobium electrolytic capacitor, and the like. The polarized capacitor 145 may be connected in series between the LPF 155 and the audio output device 150, wherein a positive terminal (+) of the polarized capacitor is connected to the LPF 155 and a negative terminal is connected to the audio output device 150. The polarized capacitor 145 generates and transmits a third output signal $V_{OUT3}$ to the audio output device 150 at a third node.

The audio output device 150 converts a signal, such as the third output signal $V_{OUT3}$, into sound waves. The audio output device 150 may comprise any suitable circuit and/or device for generating sound waves and may be selected according to the particular audio application, desired performance, and the like. For example, the audio output device 150 may comprise a speaker, a headphone, an earphone, or the like. In an exemplary embodiment, the class-D amplifier 100 is configured as a single-ended output amplifier, wherein the audio output device 150 is connected between a single output (e.g., $V_{OUT3}$) and a ground.

Embodiments of the present technology may also receive and/or generate a clock signal (not shown). Each of the interpolator circuit 110, the noise-shaper circuit 115, the PWM generator circuit 120, and the driver circuit 125 may be supplied with a respective clock signal. Each clock signal may have a different sampling rate, but all of the clock signals may be synchronized with each other.

According to an alternative system, various components described above may be used in conjunction with a bridge-tied load (BTL) amplifier configuration (not shown). In general, a bridge-tied load configuration consists of two amplifiers: one amplifier driving one side of a load (e.g., the audio output device 150) and another amplifier (with an inverted signal from the first amplifier) driving the other side of the load. For example, in the BTL configuration, the transition signal S2, the switching circuit 115, the interpolator circuit 110, the noise-shaper circuit 115, and the PWM generator circuit 120 may be connected as described above and used as an input stage for each of the two amplifiers of the BTL configuration. Further, each amplifier may receive the HiZ control signal S4. Also, in the BTL configuration, the polarizing capacitor 145 is not required. In most cases, since the load is tied across two amplifiers with the same DC bias and the signal across the load is the difference between the amplifier outputs, the DC bias is removed. However, in operation, a mismatch between the BTL amplifier's outputs may occur, which may cause the start-up noise. Accordingly, operating the BTL amplifiers in the same manner as the amplifier 125 in the class-D configuration (as described below using the transition signal S2, the switching circuit 115, the interpolator circuit 110, the noise-shaper circuit 115, the PWM generator circuit 120, and the HiZ control signal S4) will remove the start-up noise.

In operation, and referring to FIGS. 1-7, the class-D amplifier 100 utilizes the varying transition signal S2 in conjunction with the varying fourth control signal S4 to control the duty cycle and amplitude of the first output voltage $V_{OUT1}$ at the start-up of the audio system. After the first output voltage $V_{OUT1}$ passes through the LPF 155, the resulting second output voltage $V_{OUT2}$ exhibits a function that increases gradually over time. As a result of the gradual increase of the second output voltage $V_{OUT2}$, the third output voltage $V_{OUT3}$ remains substantially constant over time and suppresses the start-up noise.

Figure 3:
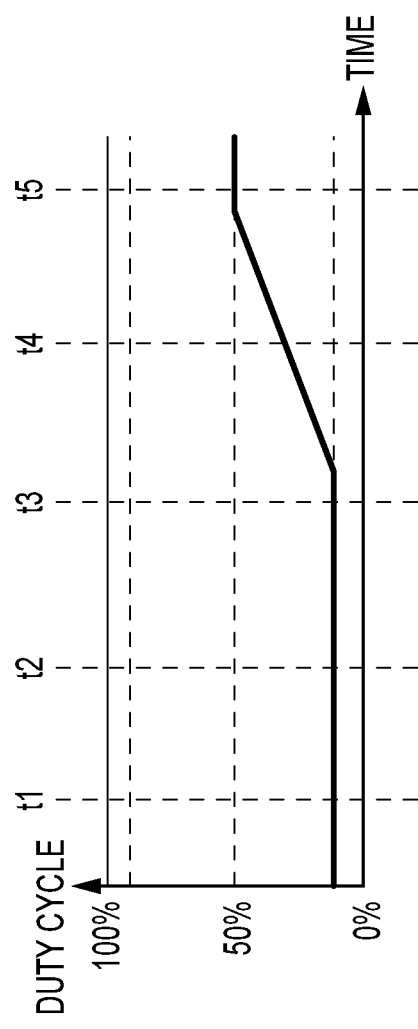
FIG. 3 is a graph illustrating the relationship between the transition signal and a duty cycle in accordance with an exemplary embodiment of the present technology.
Figure 4:
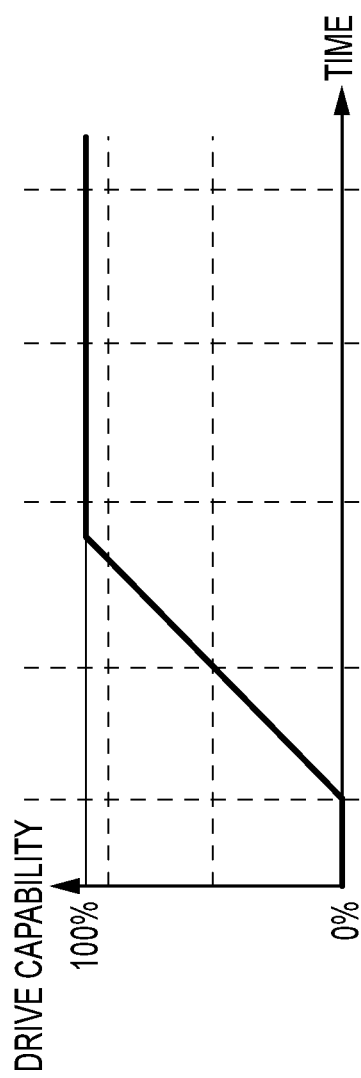
FIG. 4 is a graph illustrating the relationship between a control signal and a drive capability in accordance with an exemplary embodiment of the present technology.
Figure 8:
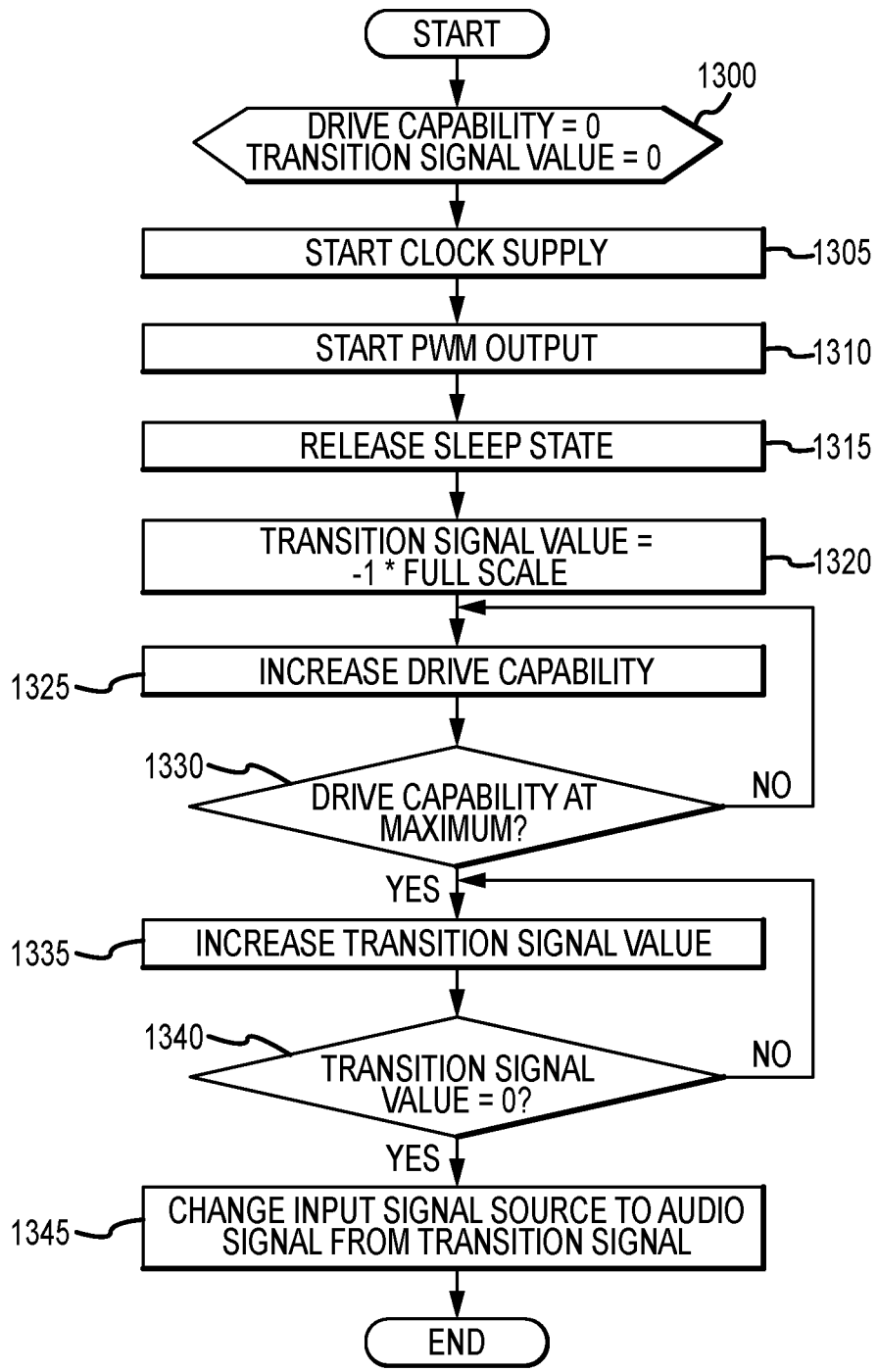
FIG. 8 is a first flowchart for operating the class-D amplifier during a start-up state and in accordance with an exemplary embodiment of the present technology.
Figure 9:
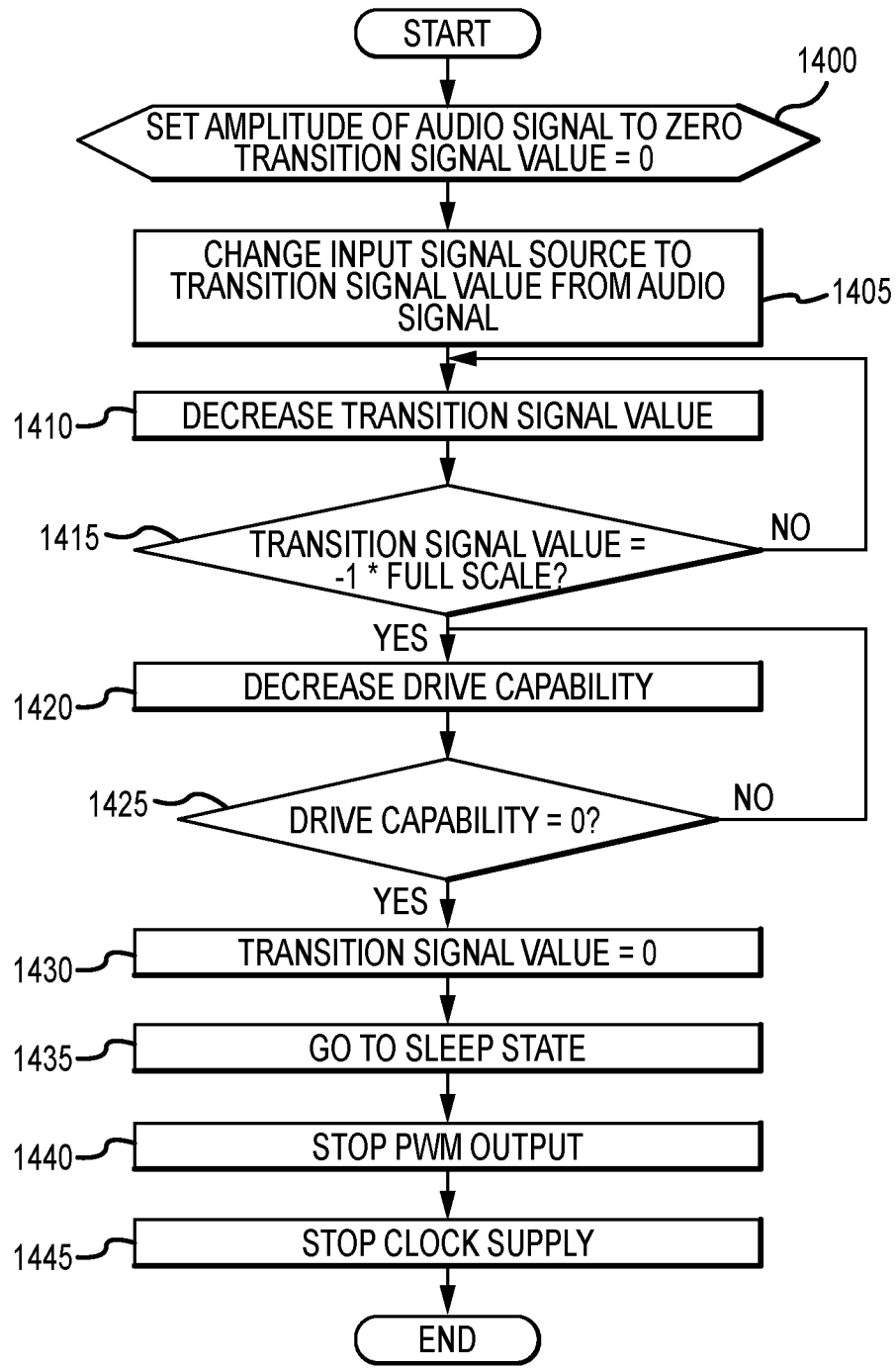
FIG. 9 is a first flowchart for operating the class-D amplifier during a shut-down state and in accordance with an exemplary embodiment of the present technology.
Figure 10:
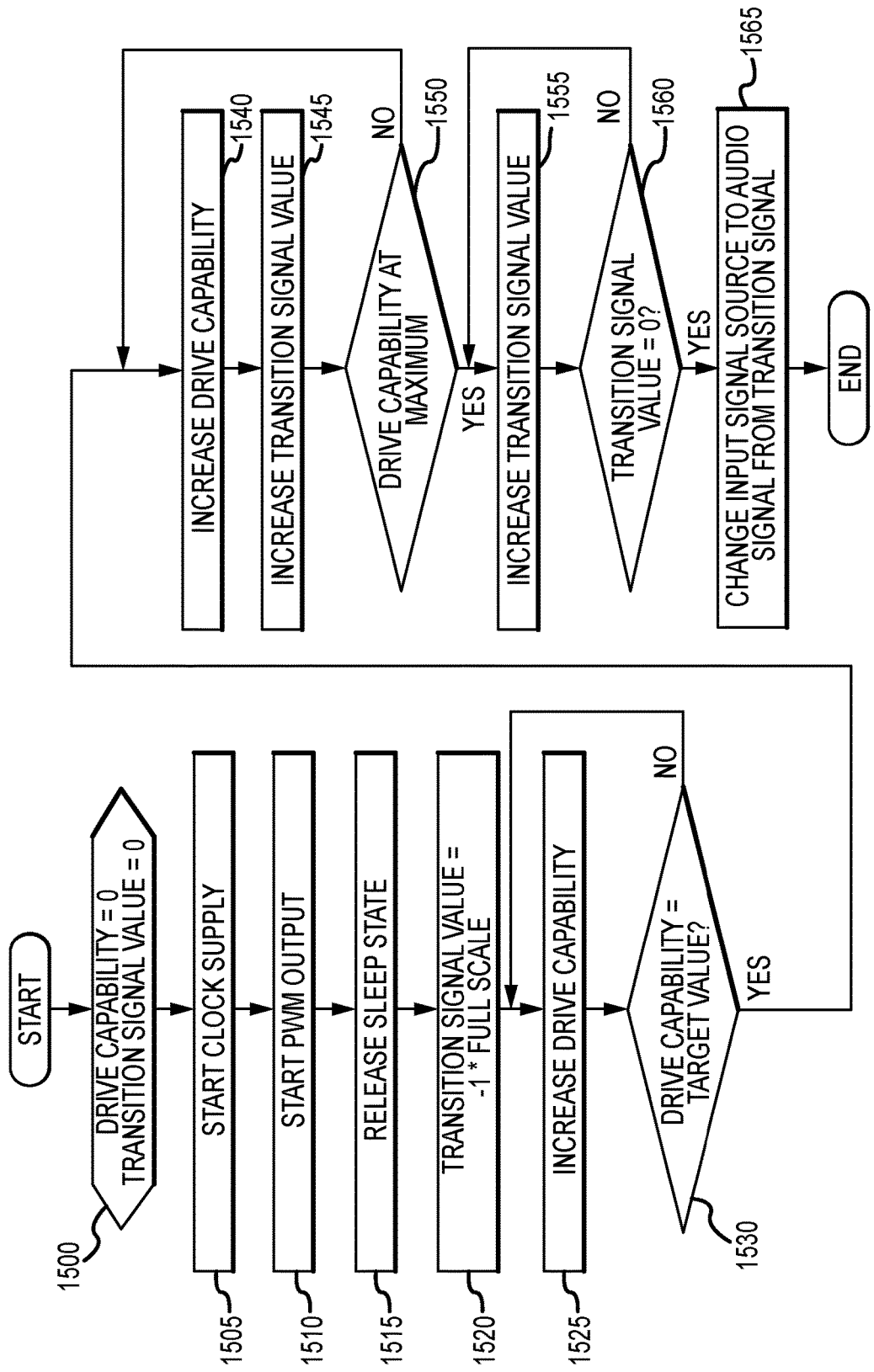
FIG. 10 is an alternative flowchart for operating the class-D amplifier during the start-up state and in accordance with an exemplary embodiment of the present technology.
Figure 11:
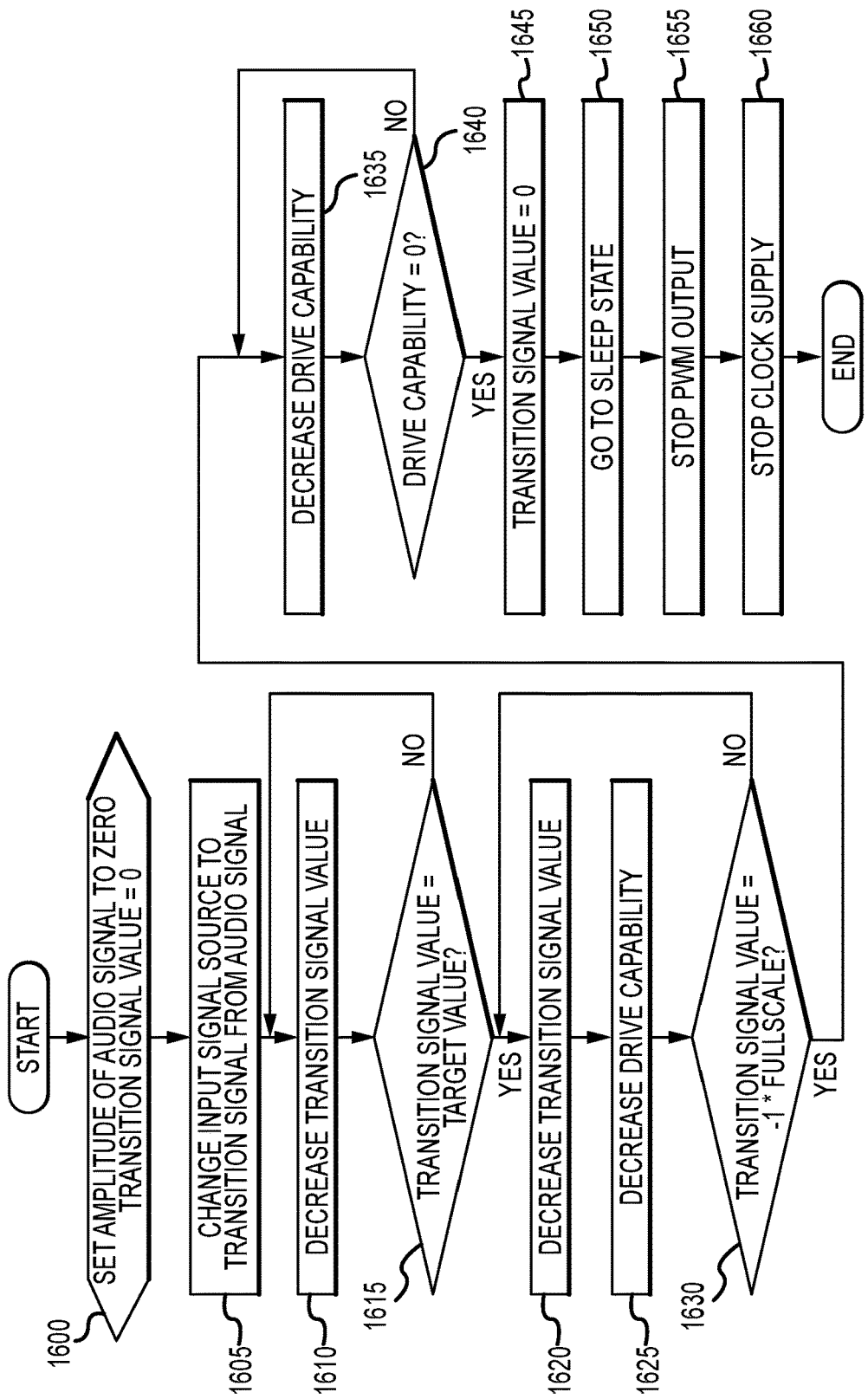
FIG. 11 is an alternative flowchart for operating the class-D amplifier during the shut-down state and in accordance with an exemplary embodiment of the present technology.

According to various operations, during a first time period (i.e., t1-t2, FIG. 5), the transition signal S2 is at a minimum value, the fourth control signal S4 increases, which increases a drive capability (FIG. 4) of the driver circuit 125 (i.e., the impedance of the driver circuit 125 is decreasing), and the duty cycle of the first output voltage $V_{OUT1}$ is at a minimum value (i.e., a starting percentage), for example 5% (FIG. 3).

During a second time period (i.e., t2-t3), the transition signal S2 remains at the minimum value, the fourth control signal S4 continues to increase until the drive capability of the driver circuit reaches 100% (i.e., the impedance of the driver circuit 125 is at its lowest), and the duty cycle of the first output voltage $V_{OUT1}$ remains at its minimum (starting) value (e.g., 5%), but the amplitude of the pulses begins to increase.

During a third time period (i.e., t3-t4), the transition signal S2 begins to increase, the fourth control signal S4 remains at a constant value corresponding to 100% drive capability of the driver circuit 125, and the duty cycle of the first output voltage $V_{OUT1}$ beings to increase from its minimum value.

During a fourth time period (i.e., t4-t5), the transition signal S2 continues to increase, the fourth control signal S4 remains constant, and the duty cycle of the first output voltage $V_{OUT1}$ continues to increase until it reaches 50%.

During a fifth time period (i.e., starting at t5), the transition signal S2 reaches a value of substantially zero and remains at the substantially zero value, the fourth control signal S4 remains constant, and the first output voltage $V_{OUT1}$ maintains a duty cycle of 50%.

According to various methods of operation, the class-D amplifier 100 may function according to various states. The class-D amplifier 100 may have a sleep (or stand-by) state, wherein the clock signals are paused and various components, such as the integrator circuit 110, the noise-shaper circuit 115, the PWM generator circuit 120, and the driver circuit 125, do not generate their respective output signals. The class-D amplifier 100 may transition from the sleep state to an operation state. This transition period may be referred to as the "start-up" or the "start-up state." Similarly, the class-D amplifier 100 may transition from the operation state back to the sleep state—this transition period may be referred to as the "shut-down" or "shut-down state."

In a first exemplary operation, and referring to FIGS. 1, 2, 4, and 8, a method for operating the class-D amplifier 100 during the start-up state comprises: setting the drive capability of the driver circuit 125 to zero and setting the transition signal S2 to zero (1300); starting the clock and supplying the clock signal to relevant components (1305); starting the PWM generator circuit 120 and generating the PWM output (1310); releasing the sleep state (1315); setting the transition signal S2 to a multiple of −1 and the full scale value of the audio signal S1 (1320); increasing the drive capability of the driver circuit 125 (1325) (i.e., decrease the impedance via the fourth control signal S4); and determining whether the drive capability is at a maximum value (i.e., 100%) (1330).

If the drive capability is at the maximum value, then the method comprises increasing the transition signal S2 value from the minimum value (1335), and if the drive capability is not at the maximum value, then the method comprises continuing to increase the drive capability until it reaches the maximum value.

The method further comprises determining whether the transition signal S2 is equal to zero (1340). If the transition signal S2 is not equal to zero, the method comprises continuing to increase the transition signal S2 value until it reaches zero, and if the transition signal S2 is equal to zero, then the method comprises changing the input signal $V_{IN}$ from the transition signal S2 to the audio signal S1 (1345).

According to the first exemplary operation, and referring to FIGS. 1, 2, 4, and 9, a method for operating the class-D amplifier 100 during the shut-down state comprises: setting the amplitude of the audio signal S1 to zero and setting the transition signal S2 to zero (1400); changing the input signal VIN from the audio signal S1 to the transition signal S2 (1405); decreasing the value of the transition signal S2 (1410); and determining if the value of the transition signal S2 is equal to the multiple of −1 and the full scale value of the audio signal S1 (1415).

If the transition signal S2 is not equal to the multiple of −1 and the full scale value, then the method comprises decreasing the value of the transition signal S2 until it reaches the desired value (i.e., S2=−1*full scale), and if the transition signal S2 does equal the multiple of −1 and the full scale value, then the method comprises decreasing the drive capability of the driver circuit 125 (1420) (i.e., increase the impedance via the fourth control signal S4).

The method further comprises determining if the drive capability is zero (1425). If the drive capability is not zero, then the method comprises continuing to decrease the drive capability until it reaches zero, and if the drive capability is equal to zero, then the method comprises setting the transition signal S2 to zero (1430).

The method further comprises: setting the amplifier 100 to a sleep state (1435); stopping the PWM generator output signal (1440); and stopping the clock supply (1445).

In an alternative operation, and referring to FIGS. 1, 2, 4, and 10, a method for operating the class-D amplifier 100 during the start-up state comprises: setting the drive capability of the driver circuit 125 to zero and setting the transition signal S2 to zero (1500); starting the clock supply to relevant components (1505); starting the PWM generator circuit 120 and generating the PWM output (1510); release a sleep state (1515); setting the transition signal S2 to a multiple of −1 and a full scale value of the audio signal S1 (1520); increasing the drive capability of the driver circuit 125 (1525) (i.e., decrease the impedance via the fourth control signal S4), and determining whether the drive capability is equal to a desired target value (1530).

If the drive capability is equal to the target value, then the method comprises increasing the drive capability (1540) and increasing the transition signal S2 value (1545). If the drive capability is not equal to the target value, then the method comprises continuing to increase the drive capability until it reaches the target value.

The method further comprises determining whether the drive capability is at a maximum value (1550). If the drive capability is at the maximum value, then the method comprises increasing the transition signal S2 value (1555), and if the drive capability is not at the maximum value, then the method comprises continuing to increase the drive capability until it reaches the maximum value.

The method further comprises determining whether the transition signal S2 is equal to zero (1560). If the transition signal S2 is not equal to zero, the method comprises continuing to increase the transition signal S2 value until it reaches zero, and if the transition signal S2 is equal to zero, then the method comprises changing the input signal $V_{IN}$ from the transition signal S2 to the audio signal S1 (1565).

In an alternative operation, and referring to FIGS. 1, 2, 4, and 11, a method for operating the class-D amplifier 100 during the shut-down state comprises: setting the amplitude of the audio signal S1 to zero and setting the transition signal S2 to zero (1600); changing the input signal VIN from the audio signal S1 to the transition signal S2 (1605); decreasing the value of the transition signal S2 (1610); and determining if the value of the transition signal S2 is equal to a desired target value (1615).

If the transition signal S2 is not equal to the target value, then method comprises decreasing the transition signal S2 value until it reaches the target value, and if the transition signal S2 is equal to the target value, then the method comprises decreasing the transition signal S2 value (1620) and decreasing the drive capability (1625).

The method further comprises determining if the value of the transition signal S2 is equal to the multiple of −1 and the full scale value of the audio signal S1 (1630). If the transition signal S2 is not equal to the multiple of −1 and the full scale value, then the method comprises decreasing the value of the transition signal S2 until it reaches the desired value (i.e., S2=−1*full scale) and decreasing the drive capability. If the transition signal S2 does equal the multiple of −1 and the full scale value, then the method comprises decreasing the drive capability of the driver circuit 125 (1635).

The method further comprises determining if the drive capability is zero (1640). If the drive capability is not zero, then the method comprises continuing to decrease the drive capability until it reaches zero, and if the drive capability is equal to zero, then the method comprises setting the transition signal S2 to zero (1645). The method further comprises: setting the amplifier 100 to a sleep state (1650); stopping the PWM generator output signal (1655), and stopping the clock supply (1660).

In the foregoing description, the technology has been described with reference to specific exemplary embodiments. The particular implementations shown and described are illustrative of the technology and its best mode and are not intended to otherwise limit the scope of the present technology in any way. Indeed, for the sake of brevity, conventional manufacturing, connection, preparation, and other functional aspects of the method and system may not be described in detail. Furthermore, the connecting lines shown in the various figures are intended to represent exemplary functional relationships and/or steps between the various elements. Many alternative or additional functional relationships or physical connections may be present in a practical system.

The technology has been described with reference to specific exemplary embodiments. Various modifications and changes, however, may be made without departing from the scope of the present technology. The description and figures are to be regarded in an illustrative manner, rather than a restrictive one and all such modifications are intended to be included within the scope of the present technology. Accordingly, the scope of the technology should be determined by the generic embodiments described and their legal equivalents rather than by merely the specific examples described above. For example, the steps recited in any method or process embodiment may be executed in any order, unless otherwise expressly specified, and are not limited to the explicit order presented in the specific examples. Additionally, the components and/or elements recited in any apparatus embodiment may be assembled or otherwise operationally configured in a variety of permutations to produce substantially the same result as the present technology and are accordingly not limited to the specific configuration recited in the specific examples.

Benefits, other advantages and solutions to problems have been described above with regard to particular embodiments. Any benefit, advantage, solution to problems or any element that may cause any particular benefit, advantage or solution to occur or to become more pronounced, however, is not to be construed as a critical, required or essential feature or component.

The terms "comprises", "comprising", or any variation thereof, are intended to reference a non-exclusive inclusion, such that a process, method, article, composition or apparatus that comprises a list of elements does not include only those elements recited, but may also include other elements not expressly listed or inherent to such process, method, article, composition or apparatus. Other combinations and/or modifications of the above-described structures, arrangements, applications, proportions, elements, materials or components used in the practice of the present technology, in addition to those not specifically recited, may be varied or otherwise particularly adapted to specific environments, manufacturing specifications, design parameters or other operating requirements without departing from the general principles of the same.

The present technology has been described above with reference to an exemplary embodiment. However, changes and modifications may be made to the exemplary embodiment without departing from the scope of the present technology. These and other changes or modifications are intended to be included within the scope of the present technology, as expressed in the following claims.

The invention claimed is:

1. An amplifier circuit configured to receive an input signal, comprising:
   an interpolator circuit configured to receive the input signal;
   a noise-shaper circuit connected in series with the interpolator;
   a pulse-width modulation (PWM) generator circuit connected in series with the noise shaper; and
   a driver circuit connected in series with the pulse-width modulation generator circuit and configured to receive:
      an output signal of the PWM generator circuit at a first input terminal; and
      a control signal at a second input terminal, wherein the control signal controls an output impedance of the driver circuit.

2. The amplifier circuit according to claim 1, wherein the noise-shaper circuit comprises a delta sigma modulator.

3. The amplifier circuit according to claim 1, wherein the PWM generator generates an output signal having a varying duty cycle and a varying amplitude.

4. The amplifier circuit according to claim 3, wherein the input signal controls the duty cycle of the output signal.

5. The amplifier circuit according to claim 4, wherein the duty cycle increases gradually from a starting percentage up to fifty percent as the input signal increases.

6. The amplifier circuit according to claim 1, wherein a starting value of the input signal is less than zero.

7. The amplifier circuit according to claim 1, wherein increasing the control signal increases a drive capability of the driver circuit.

8. The amplifier circuit according to claim 1, wherein, when the output impedance of the driver reaches a predetermined value, the input signal is increased to zero.

9. The amplifier circuit according to claim 1, further comprising a low pass filter connected to an output terminal of the driver circuit and comprises an inductor connected to a capacitor.

10. A method for suppressing noise in an audio system, comprising:
   generating a transition signal;
   controlling a duty cycle of an output signal of a PWM generator circuit according to the transition signal;
   controlling an output impedance of a driver circuit according to a control signal; and
   increasing the transition signal from a minimum value to a zero value after the output impedance reaches a predetermined value.

11. The method according to claim 10, wherein:
   as the transition signal increases, the duty cycle of the output signal increases; and
   as the control signal increases, the output impedance decreases.

12. The method according to claim 10, wherein the duty cycle increases gradually from a starting percentage up to 50%.

13. The method according to claim 10, wherein an output voltage of the audio system is substantially constant during a first period when the control signal is increasing and a second period when the transition signal is increasing.

14. An audio system configured to generate audio input signal and a transition input signal, comprising:
   a class-D amplifier circuit comprising:
      a selector circuit configured to selectively transmit one of the audio signal and the transition signal to an input terminal of an interpolator circuit;
      a noise-shaper circuit connected to an output terminal of the interpolator;
      a pulse-width modulation (PWM) generator circuit connected to an output terminal of the noise-shaper circuit, wherein the PWM generator circuit generates a first output signal having a variable duty cycle controlled according to the transition input signal; and
      a driver circuit connected to an output terminal of the pulse-width modulation generator circuit and configured to generate a second output signal according to:
         the first output signal; and
         a control signal; and
   a speaker connected to the class-D amplifier circuit, wherein the class-D amplifier circuit transmits a substantially constant third output voltage to the speaker during a start-up state.

15. The audio system according to claim 14, wherein the noise-shaper circuit comprises a delta sigma modulator.

16. The audio system according to claim 14, wherein, during the start-up state, the transition input signal is set to a minimum value less than zero, and the control signal increases.

17. The audio system according to claim 14, wherein the control signal controls an output impedance of the driver circuit.

18. The audio system according to claim 17, wherein, when an output impedance of the driver circuit reaches a predetermined value, the transition input signal is increased to zero.

19. The audio system according to claim 14, wherein:
   the duty cycle of the first output signal increases gradually from a starting percentage up to 50% as the input signal increases; and
   an amplitude of the first output signal increases as the duty cycle increases.

* * * * *